United States Patent
Kreuzer et al.

(10) Patent No.: US 9,602,076 B1
(45) Date of Patent: Mar. 21, 2017

(54) RESONATORS WITH BALANCING CAPACITOR

(71) Applicant: TriQuint Semiconductor, Inc., Hillsboro, OR (US)

(72) Inventors: Susanne Kreuzer, Sorrento, FL (US); Alexandre Volatier, Longwood, FL (US); Robert Aigner, Ocoee, FL (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/716,582

(22) Filed: May 19, 2015

(51) Int. Cl.
H03H 9/00 (2006.01)
H03H 9/205 (2006.01)
H03H 9/15 (2006.01)

(52) U.S. Cl.
CPC .................. H03H 9/205 (2013.01)

(58) Field of Classification Search
CPC ... H03H 9/0095; H03H 9/02125; H03H 9/542
USPC ................................................. 333/187–192
See application file for complete search history.

(56) References Cited

U.S. PATENT DOCUMENTS

| | | | | |
|---|---|---|---|---|
| 6,496,085 B2 * | 12/2002 | Ella | ................ | H03H 3/04 29/25.35 |
| 6,670,866 B2 * | 12/2003 | Ella | ................ | H03H 9/0095 310/366 |
| 6,975,183 B2 * | 12/2005 | Aigner | ................ | H03H 9/0095 29/25.35 |
| 6,977,563 B2 * | 12/2005 | Komuro | ................ | H03H 3/04 333/187 |
| 7,057,478 B2 * | 6/2006 | Korden | ................ | H03H 9/0095 333/189 |
| 7,378,781 B2 * | 5/2008 | Vilander | ................ | H03H 9/02102 310/315 |
| 7,388,455 B2 * | 6/2008 | Larson, III | ................ | H03H 9/132 333/189 |
| 7,728,485 B2 * | 6/2010 | Handtmann | ................ | H03H 9/0207 216/2 |
| 7,791,435 B2 * | 9/2010 | Jamneala | ................ | H03H 9/584 333/133 |
| 7,795,998 B2 * | 9/2010 | Mayer | ................ | H03H 9/175 310/335 |
| 7,825,749 B2 * | 11/2010 | Thalhammer | ................ | H03H 3/04 333/133 |
| 8,576,024 B2 * | 11/2013 | Erb | ................ | H03H 9/0095 333/133 |
| 8,593,234 B2 * | 11/2013 | Bar | ................ | H03H 3/02 310/335 |
| 8,674,789 B2 * | 3/2014 | Pang | ................ | H03H 9/0095 333/189 |
| 9,461,618 B2 * | 10/2016 | Pang | ................ | H03H 9/54 |
| 2011/0316649 A1 * | 12/2011 | Link | ................ | H03H 9/605 333/189 |
| 2014/0085020 A1 * | 3/2014 | Reinhardt | ................ | H03H 3/04 333/188 |

\* cited by examiner

*Primary Examiner* — Dean Takaoka
(74) *Attorney, Agent, or Firm* — Withrow & Terranova, P.L.L.C.

(57) ABSTRACT

Embodiments provide a solidly-mounted bulk acoustic wave (BAW) resonator and method of making same. In embodiments, the BAW resonator may include a first resonator and a second resonator that are coupled with one another via a top electrode layer. A capacitive element may be included in the BAW resonator in parallel with the first resonator. Other embodiments may be described and claimed.

19 Claims, 9 Drawing Sheets

RESONATORS WITH BALANCING CAPACITOR

FIELD

Embodiments of the present disclosure relate generally to the field of resonators, and more particularly to intermodulation distortion (IMD) and harmonics response improvements in bulk acoustic wave (BAW) resonators.

BACKGROUND

Harmonics and IMD performance may be an important specification for many telecommunication applications such as filters and duplexers. The IMD may be caused by intrinsic non-linear behavior of an acoustic resonator. This means that a resonator excited at a certain frequency may show a response not only at the excitation frequency (i.e., the fundamental frequency of the resonator), but also at other harmonic and/or intermixing frequencies.

As used herein, harmonic contributions may influence the performance of the resonator at multiples of the fundamental frequency. In embodiments, the harmonics that occur at twice the fundamental frequency may be the greatest. Thus, although an acoustic filter may have good small-signal rejection for high frequency signals, there may be output power generated at harmonic frequencies that may exceed system specifications.

As used herein, IMD may by a specification defined for resonators that use different frequency bands for uplink (i.e., transmit band or Tx band) and downlink (i.e., receive band or Rx band). Applying a signal at the transmit port and a second signal of a different frequency at an antenna port of a device may result in the two signals intermixing in a non-linear device, which may further result in signals generated at additive and subtractive combinations of the different frequencies. These signals may result in noise at a receive port of the device.

BRIEF DESCRIPTION OF THE DRAWINGS

Embodiments are illustrated by way of example and not by way of limitation in the figures of the accompanying drawings, in which like references indicate similar elements.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms comprising, having, and including are synonymous, unless the context dictates otherwise.

The phrase "coupled with," along with its derivatives, may be used herein. Coupled may mean that two or more elements are in direct physical or electrical contact. However, coupled may also mean that two or more elements indirectly contact each other, but yet still cooperate or interact with each other, and may mean that one or more other elements are coupled or connected between the elements that are said to be coupled with each other.

In various embodiments, the phrase "a first layer formed on a second layer" may mean that the first layer is formed, disposed, or otherwise configured over the second layer, and at least a part of the first layer may be in direct contact (e.g., direct physical and/or electrical contact) or indirect contact (e.g., having one or more other layers between the first layer and the second layer) with at least a part of the second layer.

As noted above, undesirable IMD and/or harmonics response in modules such as filters, duplexers, etc. may be caused by intrinsic non-linear behavior of one or more resonators used in the module. Generally, the IMD and/or harmonics response may be at least partially mitigated by arranging at least two resonators of the module in cascading or anti-parallel connections. In this arrangement, the two resonators may operate with a 180 degree phase shift, and therefore the total non-linear response of the module may cancel out.

However, in legacy real world embodiments, connection between the two resonators may introduce a capacitive and/or inductive parasitic effect such that perfect cancellation of the non-linear response may not be feasible. Rather, as the cancellation is diminished, the harmonics response and/or IMD signal may not be fully suppressed, and the resulting perturbing signal may be detectable in harmonic and/or IMD measurements as spikes, which may dramatically decrease the overall non-linear performance of the filter/module under test.

Figure 1:
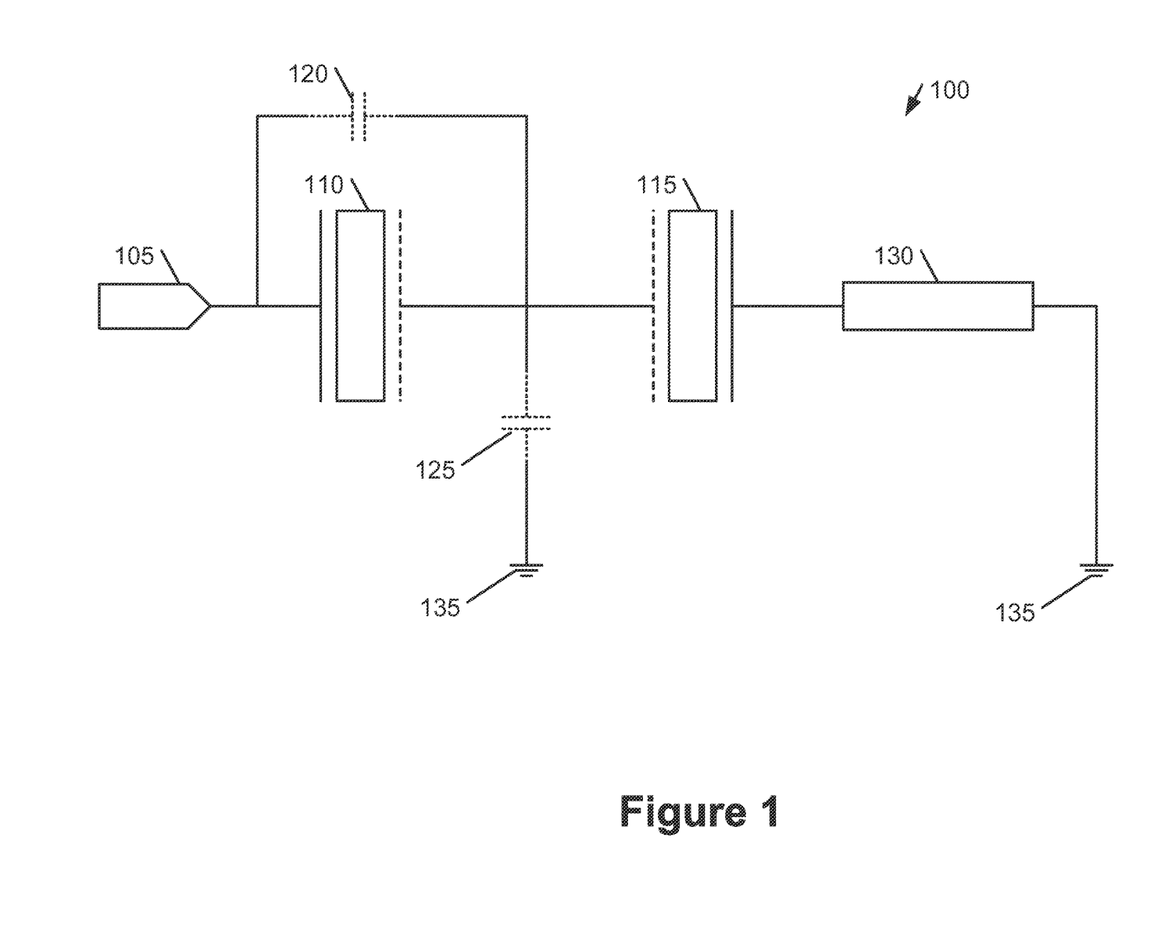
FIG. 1 illustrates an example circuit to be implemented in resonators, in accordance with some embodiments.

FIG. 1 depicts an example circuit 100 that may be implemented in one or more resonators. It will be understood that the example circuit 100 may be implemented via physical structures of one or more filters and/or modules, and is merely depicted here to help explain concepts related to those filters/modules.

The example circuit 100 may include an input 105 coupled with a pair of resonators 110 and 115. As depicted herein, the resonators 110 and 115 may be coupled with one another, and the parasitic effect described above may be represented by a parasitic capacitor 125 draining to ground 135. The resonators 110 and 115 may include a top electrode that is designated by a dotted line in FIG. 1, and the resonators 110 and 115 may further include a bottom electrode that is designated by a solid line in FIG. 1. For example, resonator 110 may have the bottom electrode on the left and the top electrode on the right, as depicted in FIG. 1, while resonator 115 may have the bottom electrode on the right and the top electrode on the left, as depicted in FIG. 1.

The parasitic capacitor 125 is indicated by dashed lines because the parasitic capacitor 125 may not be implemented as an actual physical capacitor coupled with the filter/module, but instead illustrates a parasitic capacitive effect that may occur in the filter/module. Generally, the parasitic capacitor 125 may be generated by a parasitic capacitive structure, as explained in further detail below. Specifically, the absolute value of the capacitive effect of parasitic capacitor 125 may be based on the area/size of the resonators 110 and 115, the connection metal geometry, and/or what sort of material the filter/module may use. In some embodiments, the parasitic capacitance may also be based on whether the top electrodes of the resonators 110 and 115 or the bottom electrodes of the resonators 110 and 115 are used to couple the resonators 110 and 115 to one another. In some embodiments, the bottom electrodes of the resonators 110 and 115 may be embedded in a dielectric, which may cause the parasitic capacitance to be relatively high if the bottom electrodes are used to couple resonators 110 and 115 to one another. By contrast, the top electrodes of the resonators 110 and 115 may not be embedded in a dielectric, so the parasitic capacitance may be relatively low if the top electrodes of resonators 110 and 115 are used to couple the resonators 110 and 115 to one another as shown in FIG. 1.

Generally, in legacy circuits that may only include the input 105, resonators 110 and 115, parasitic capacitance 125 and ground 135, the current $I_2$ through resonator 115 may be smaller than the current $I_1$ through resonator 110. Specifically, the current between resonators 110 and 115 may be draining to ground via the parasitic capacitor 125, thereby reducing the current $I_2$ through resonator 115. Based on this difference in currents $I_1$ and $I_2$, a perfect cancellation of the non-linear response of each resonator may not be possible in the legacy circuits.

However, in embodiments herein, the circuit 100 may include a balancing capacitor 120 that may generate a balancing capacitive effect. Generally, the balancing capacitor 120 may be formed of a capacitive structure, as described in further detail below. In some embodiments, the circuit 100 may further include a load 130 positioned between the resonator 115 and ground 135. The balancing capacitor is indicated as dashed because the balancing capacitor 120 may not be a physical capacitor inserted into the circuit, but instead an arrangement of elements in the filter/module that produces a balancing capacitive effect, and the balancing capacitor 120 is depicted in FIG. 1 to illustrate where that effect may occur. As depicted in FIG. 1, the filter/module may be configured such that the balancing capacitor 120 is in parallel with the resonator 110.

Generally, the currents $I_1$ and $I_2$ may be balanced by the balancing capacitor 120, which may improve the overall non-linear response of the resonators 110 and 115. A general equation of the balancing component may be described as ZBalancing and $$Z_{Balancing} = \frac{Z_{Resonator1} * Z_{Parasitic}}{Z_{Resonator2} + Z_{Load}} \quad \text{(Equation 1)}$$

wherein $Z_{Resonator1}$ is the load impedance of resonator 110, ZParasitic is the load impedance of the parasitic capacitor 125, $Z_{Resonator2}$ is the load impedance of the resonator 115, and $Z_{Load}$ is the load impedance of the load 130. As can be seen from equation 1, the value of the load $Z_{Balancing}$ of the balancing capacitor 120 may be on the order of the load of the parasitic capacitor 125, $Z_{Parasitic}$. In embodiments, this value may be in the range of approximately 5-20 femto Farad (fF), though in other embodiments the value may be different. Typically, the capacitance of a resonator such as resonators 110 and 115 may be on the order of pico Farads (pF), which may be up to three orders of magnitude higher than the example fF range of the balancing capacitor 120. Thus, the balancing capacitor 120 may not impact the linear performance of the resonators 110 and/or 115.

Figure 2:
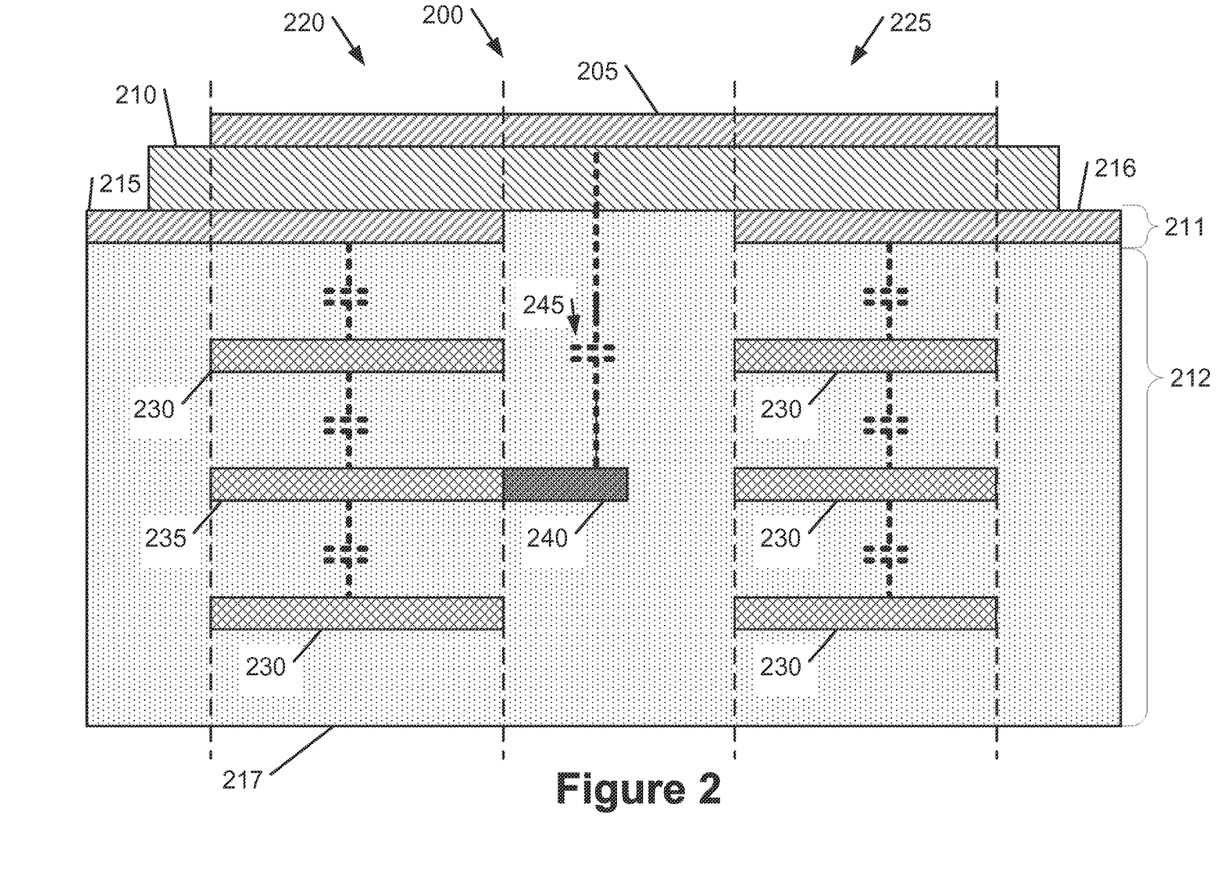
FIG. 2 is an example BAW resonator, in accordance with some embodiments.

FIG. 2 depicts an example design that may be used in a BAW, a solidly mounted resonator (SMR) BAW, a firm bulk acoustic resonator (FBAR), or some other type of resonator. Embodiments herein will be described in terms of a BAW resonator, and particularly an SMR BAW, though other embodiments may use different design structures.

The SMR BAW 200 of FIG. 2 may include a top electrode layer 205, a piezoelectric layer 210, and a bottom electrode layer 211 that may include bottom electrodes 215 and 216. In embodiments, the top electrode layer 205 and/or the bottom electrode layer 211 may include or be made of Tungsten (W), an Aluminum-Copper compound (AlCu), and/or some other electrode material. The piezoelectric layer 210 may include or be made of Aluminum Nitride (AlN), and/or some other appropriate piezoelectric material.

The SMR BAW 200 may further include a reflective layer 212 coupled with the bottom electrode layer 211 and/or the piezoelectric layer 216. The reflective layer 212 may include dielectric 217, which may be a dielectric material such as Silicon Oxide ($SiO_2$) and/or some other dielectric material. The reflective layer 212 may further include one or more layers of mirror metal 230 and 235. The mirror metal 230 and 235 may be made of or otherwise include Tungsten (W) and/or some other appropriate mirror metal material. In embodiments, the SMR BAW 200 may include a first resonator 220 that may be similar to resonator 110 and a second resonator 225 that may be similar to resonator 115. Specifically, the resonators 220 and 225 may be structures within the SMR BAW 200 as indicated by the dashed lines. For example, the resonator 220 may be formed based on the physical stack of the top electrode layer 205, the piezoelectric layer 210, the bottom electrode 215, the dielectric 217, and the mirror metals 230 and 235. Similarly, the resonator 225 may be formed of the top electrode layer 205, the piezoelectric layer 210, the bottom electrode 216, the dielectric 217, and the mirror metals 230. In some embodiments, the SMR BAW 200 may include a substrate (not shown) coupled with the reflective layer 212 at the bottom of the SMR BAW 200 as depicted in FIG. 2. The substrate may be, for example, silicon (Si) or some other substrate material.

Generally, the mirror metals 230 and 235 are depicted as having a capacitance between respective layers of the mirror metal 230/235, and the bottom electrode layer 211. This capacitive effect is illustrated by the dashed capacitors depicted in FIG. 2. The illustrated dashed capacitors are not included to show that a physical capacitor is placed in the SMR BAW 200 in, for example, the reflective layer (though they may be in some embodiments), but instead are intended to depict the capacitive effect that may occur within the SMR BAW 200 between respective layers.

Similarly to the example circuit 100 depicted in FIG. 1, it can be seen that the resonators 220 and 225 of FIG. 2 may be coupled to one another via the top electrode layer 205. Based on this coupling, a parasitic capacitive effect may occur within SMR BAW 200. Therefore, it may be desirable to introduce a balancing capacitive structure such as balancing capacitor 120 in parallel with resonator 220. In the embodiment depicted in FIG. 2, SMR BAW 200 may include an extended area 240. The extended area 240 may be coupled with mirror metal 235, and be made of a material similar to that of mirror metal 235. In other embodiments, the extended area 240 may be made of a material that is different than that of mirror metal 235 Generally, the extended area 240 may be considered to be a capacitive element, that is, it may cause or generate a capacitive effect in the SMR BAW 200 as described below.

As depicted in FIG. 2, the extended area 240 may be at a part of the SMR BAW 200 that is outside of resonators 220 and 225, and also at a part of the SMR BAW 200 where there is no electrode material in the bottom electrode layer 211. For example, as shown in FIG. 2, bottom electrodes 215 and 216 are not continuous for reasons explained above, and the extended area 240 may be located at a portion of the SMR BAW 200 where the bottom electrode layer 211 is discontinuous. Therefore, the extended area 240 may form a capacitive effect 245 with the top electrode layer 205. Although this capacitive effect 245 is indicated in FIG. 2 as a capacitor, it will be understood that the capacitive effect 245 may be an effect generated due to an interaction between the extended area 240 and the top electrode layer 205, and not the result of insertion of a physical capacitor inside of the SMR BAW 200. The capacitive effect 245 may be equivalent to the balancing capacitor 120 depicted in FIG. 1.

In some embodiments, the parasitic capacitive effect may be based on factors such as the height of various layers of the SMR BAW 200, the type of material used (e.g., the dielectric constant of the dielectric 217 of the reflective layer 212), and/or the area of the various mirror metals 230 and 235. Those factors may also be relatively constant for the balancing capacitive effect, and so the size, and particularly the lateral area, of the extended area 240 may be altered to achieve a desired amount of balancing capacitance within the SMR BAW 100.

Figure 3:
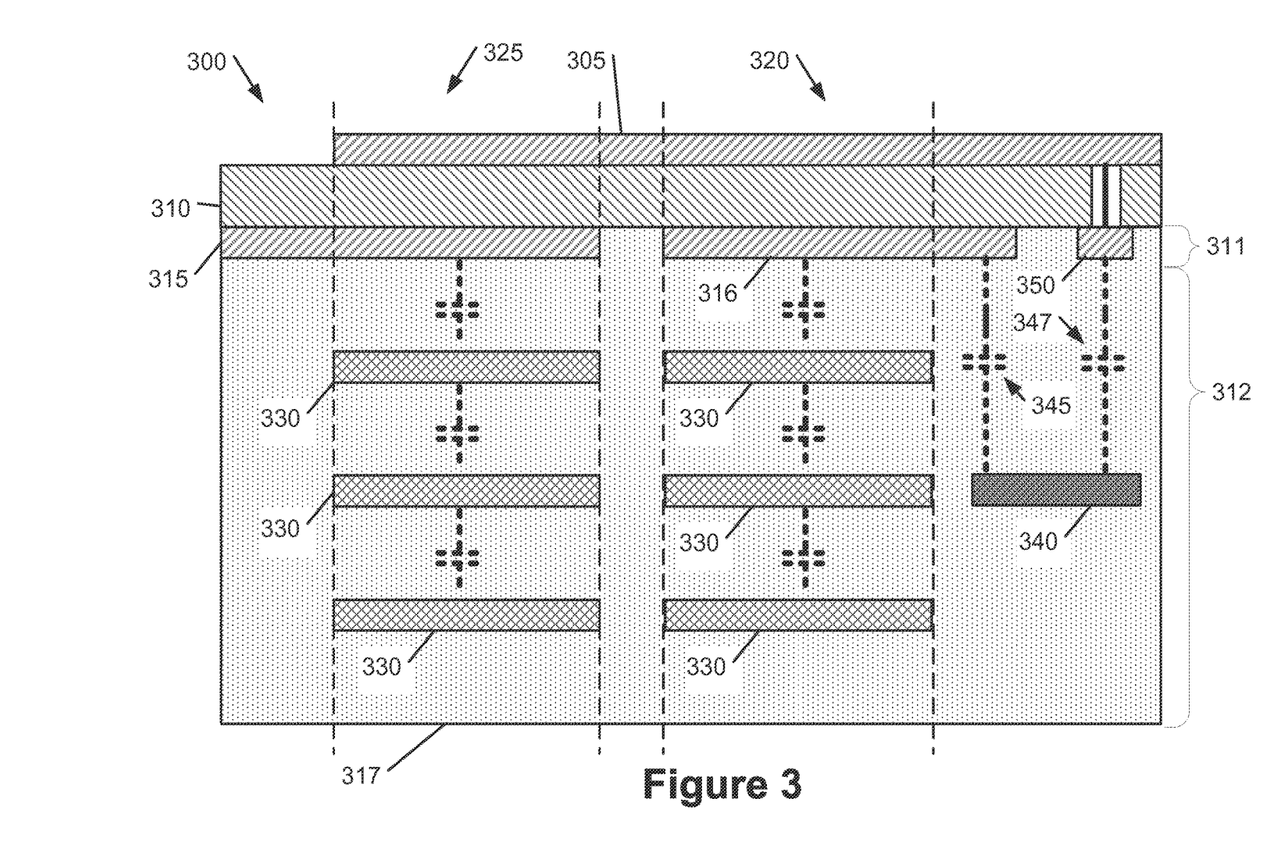
FIG. 3 is an alternative example BAW resonator, in accordance with some embodiments.

FIG. 3 depicts an alternative example of an SMR BAW 300 that may be similar to SMR BAW 200. Specifically, SMR BAW 300 may include a top electrode layer 305, a piezoelectric layer 310, a bottom electrode layer 311 that may include bottom electrodes 315 and 316, and a reflective layer 312 that may include dielectric 317 and mirror metals 330 that may be respectively similar to top electrode layer 205, piezoelectric layer 210, bottom electrode layer 211, bottom electrodes 215 and 216, reflective layer 212, dielectric 217, and mirror metals 230. SMR BAW 300 may further include resonators 320 and 325 that may be respectively similar to resonators 220 and 225.

In some embodiments, the reflective layer 312 may further include an extended area 340 that is separate from mirror metals 330. The extended area 340 may have a lateral area that is based on a desired capacitance of the resultant balancing capacitive effect caused by the extended area 340. For example, the capacitance may be further based on relatively constant factors such as the height of various layers of the SMR BAW 300, the type of material used (e.g., the dielectric constant of the dielectric 317 of the reflective layer 312), and/or the area of the various mirror metals 330. In embodiments, the extended area 340 may be located at least partially under the bottom electrode 316 of resonator 320, and generate a capacitive effect 345 between the extended area 340 and the bottom electrode 316. The extended area 340 may additionally be located at least partially under an extra electrode element 350 that may be electrically coupled with top electrode layer 305 by way of, for example, a via. In other embodiments, the top electrode layer 305 may physically dip to be at the same level as the bottom electrode layer 311 in the area of the extra electrode element 350. In some embodiments, the extra electrode element 350 may be formed of the same material as top electrode layer 305, bottom electrodes 315 and/or 316, or some other electrode material. The extended area 340 may generate a capacitive effect 347 between the extended area 340 and the extra electrode element 350, as indicated in FIG. 3.

Similarly to capacitive effect 245, the capacitive effects 345 and 347 may not be physical capacitors inserted into the structure of SMR BAW 300, but instead may be effects generated based on interactions between the extended area 340 and the bottom electrode 316 or extra electrode element 350, respectively. Hence, capacitive effects 345 and 347 are indicated by the dashed lines in FIG. 3.

Figure 4:
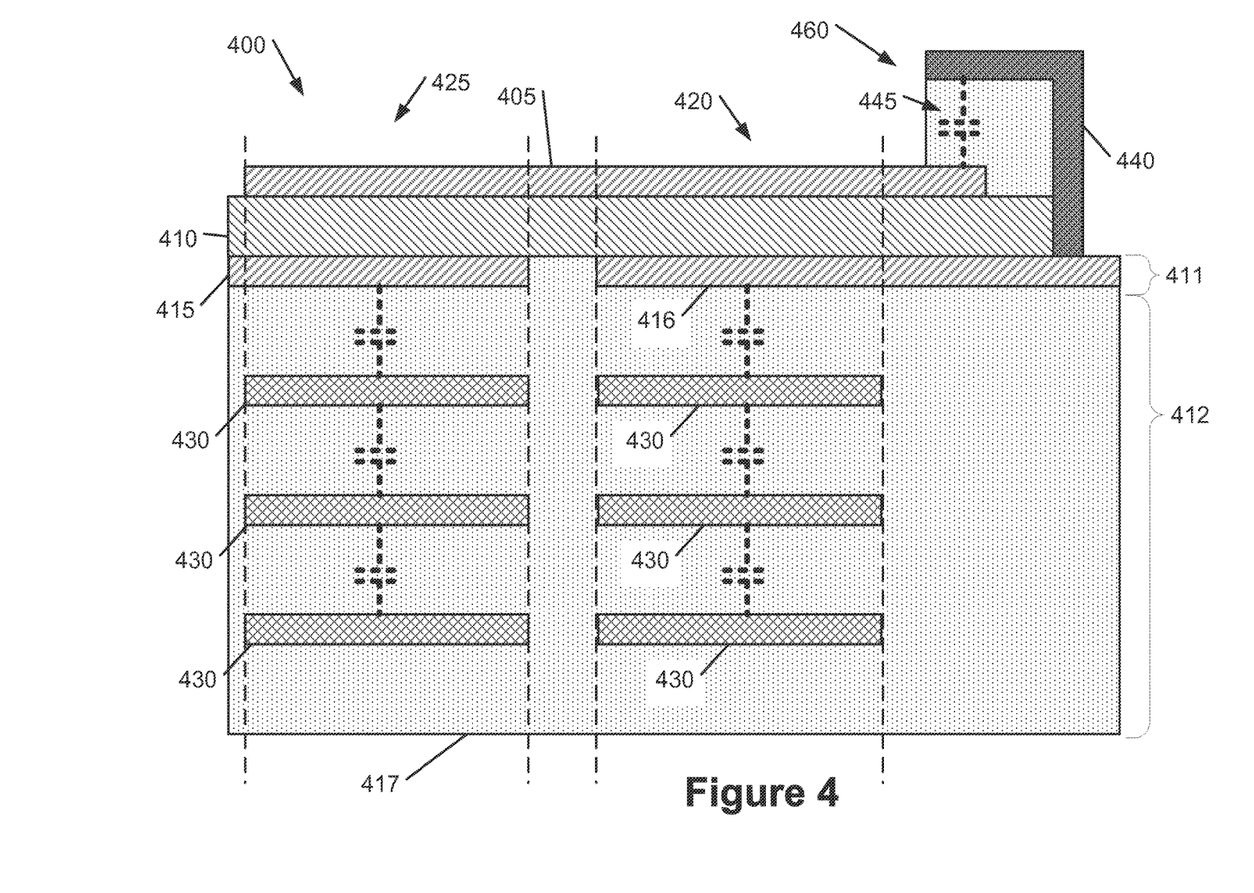
FIG. 4 is an alternative example BAW resonator, in accordance with some embodiments.

FIG. 4 depicts an alternative example of an SMR BAW 400 that may be similar to SMR BAW 200. Specifically, SMR BAW 400 may include a top electrode layer 405, a piezoelectric layer 410, a bottom electrode layer 411 that may include bottom electrodes 415 and 416, and a reflective layer 412 that may include dielectric 417 and mirror metals 430 that may be respectively similar to top electrode layer 205, piezoelectric layer 210, bottom electrode layer 211, bottom electrodes 215 and 216, reflective layer 212, dielectric 217, and mirror metals 230. SMR BAW 400 may further include resonators 420 and 425 that may be respectively similar to resonators 220 and 225.

In embodiments, the SMR BAW 400 may further include an extended area 440 that may be directly coupled with at least the bottom electrode layer 411, and specifically the bottom electrode 416. In embodiments, the extended area 440 may extend above the top electrode layer 405, for example, by being a part of a bump 460 on the SMR BAW 400. In embodiments, the bump 460 may include a dielectric material that may be similar to dielectric 417, or may be some other type of dielectric material. The extended area 440 may generate a capacitive effect 445 between the extended area 440 and the top electrode layer 405, as indicated in FIG. 4.

Similarly to capacitive effect 245, the capacitive effect 445 may not be a physical capacitor inserted into the structure of SMR BAW 400, but instead may be an effect generated based on interactions between the extended area 440 and the top electrode layer 405. Hence, capacitive effect 445 is indicated by the dashed line in FIG. 4.

The balancing capacitive effect depicted in SMR BAWs 200, 300, or 400 may provide several advantages. For example, by adding a balancing capacitor 120, the non-linear excitation of resonators such as resonators 110/115, 220/225, 320/325, and/or 420/425 may be adjusted so that the resulting response is decreased, and the harmonic response/IMD of the resonators is improved. Additionally, the balancing capacitor 120 may be easily implemented in SMR BAWs 200/300/400. Specifically, the capacitance of the balancing capacitor 120 may be in the range of several fF, as described above, which means that the lateral area of extended area 240/340/440 may be relatively small. Therefore, the die size of SMR BAWs 200/300/400 may not be affected. In some embodiments, implementing the balancing capacitor 120 in SMR BAWs 200/300/400 may not require any additional steps or elements in pre-existing process flows. As noted above, the balancing capacitor may be implemented in BAWs, SMR BAWs, FBARs, or other resonator chips.

Additionally, depending on the module design and the specifications required, the response of more than one cascaded resonator pair may need to be adjusted. It may be relatively easy to apply respective balancing capacitors such as balancing capacitor 120 to each resonator pair in a module.

Additionally, the linear operation of the resonators may not be impacted. Therefore, the linear response of the module may be maintained, while the harmonic and/or IMD response of the modules may be optimized.

Generally, the inclusion of the balancing capacitor 120 in one of SMR BAWs 200/300/400 may compensate for parasitic capacitance in cascaded acoustic resonator pairs in order to achieve improved cancellation of second order nonlinearities. Additionally, a balancing capacitor of appropriate size (i.e., with a load impedance of $Z_{Balancing}$ as described above) may lead to improved harmonics and IMD performance of a module that uses an SMR BAW such as SMR BAWs 200/300/400.

Figure 5:
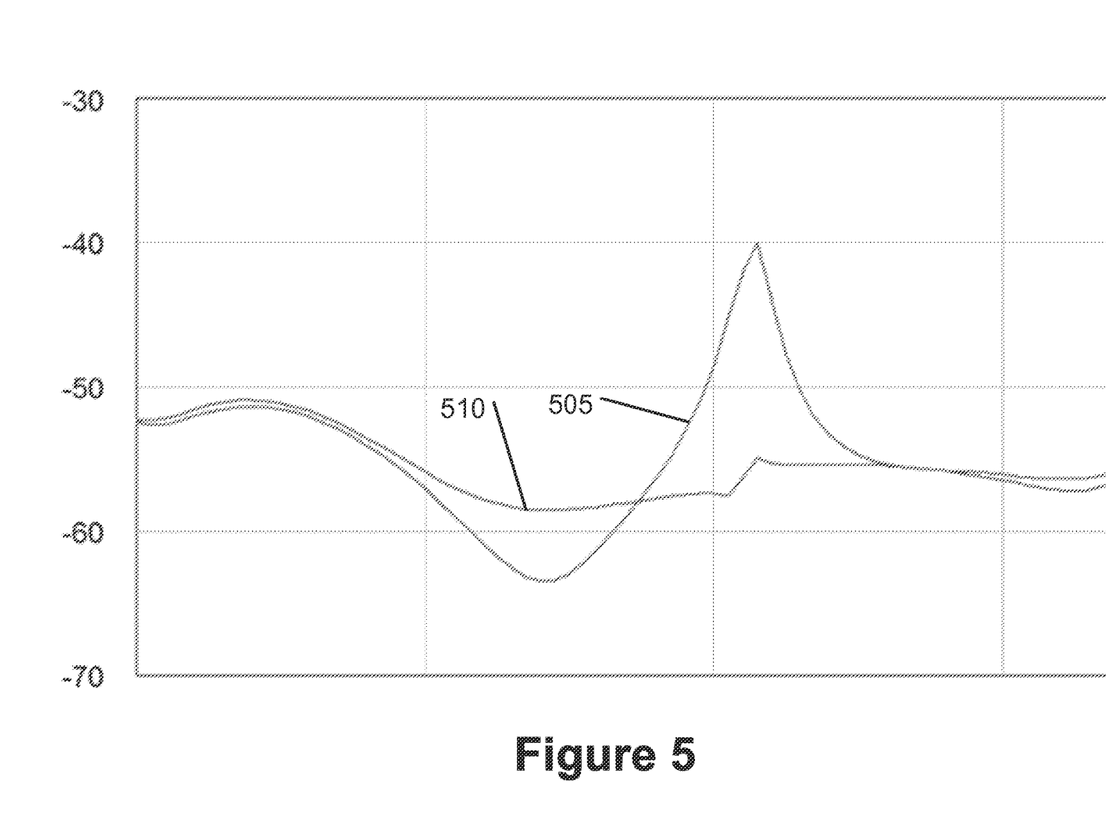
FIG. 5 is a graph of simulated results of performance of an example BAW resonator, in accordance with some embodiments.

FIG. 5 depicts a simulated example of second harmonic performance in a BAW such as SMR BAWs 200/300/400. Generally, the y axis indicates power measured in decibel-milliwatts (dBm), and the x axis indicates frequency measured in Megahertz (MHz). Line 505 indicates a legacy SMR BAW without a balancing capacitor such as balancing capacitor 120. Line 510 indicates an embodiment of an SMR BAW such as SMR BAWs 200/300/400 with an implementation of balancing capacitor 120. As can be seen with line 505, the legacy SMR BAW may experience a significant power spike at a certain frequency. However, the SMR BAW with the balancing capacitor 120 may not experience the same power spike, or at least experience a much reduced power spike, as indicated by line 510.

Figure 6:
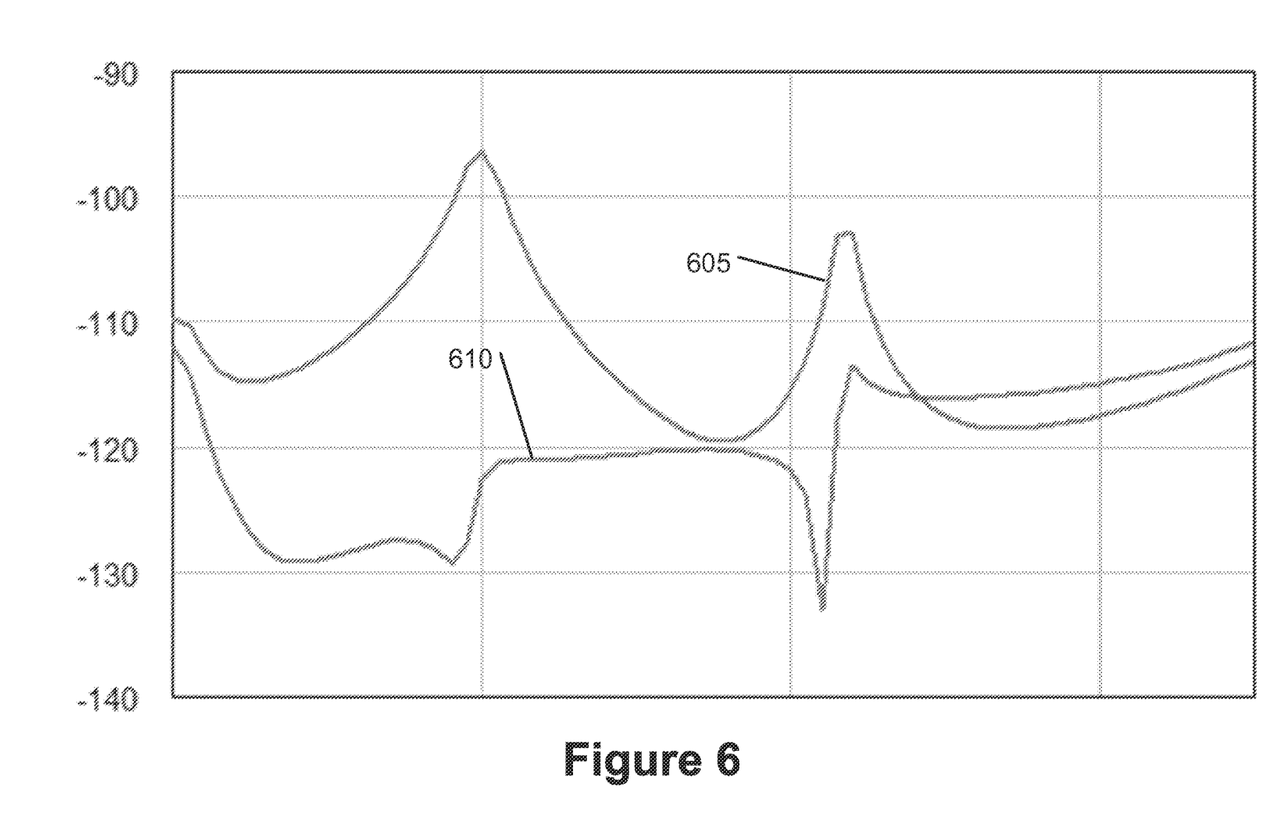
FIG. 6 is a graph of simulated results of performance of an example BAW resonator, in accordance with some embodiments.

FIG. 6 depicts a simulated example graph related to InterModulation Distortion 2 Low (IMD2L). Generally, IMD2L may be an intermixing process wherein signals having two tones or frequencies are applied to a module. The "2L" may indicate that the intermixed product of those tones is generated as the sum of the two tones. The "L" may indicate that the tone at the antenna (ANT) side of the module may be at a low frequency. The (IMD2L) characteristic may be measured in the receive passband (aka Rx passband) for a signal applied in the transmit passband (i.e., the Tx passband) and a signal applied at the antenna side, where the signal in the Rx passband is assumed to be a sum of the signal applied in the transmit passband and the signal applied in the antenna side. Generally, the y axis indicates power measured in dBm, and the x axis indicates frequency measured in MHz. Line 605 indicates a legacy SMR BAW without a balancing capacitor such as balancing capacitor 120. Line 610 indicates an embodiment of an SMR BAW such as SMR BAWs 200/300/400 with an implementation of balancing capacitor 120. As can be seen with line 605, the legacy SMR BAW may experience two significant power spikes as frequency increases. However, the SMR BAW with the balancing capacitor 120 may not experience the same power spikes, or at least experience reduced power spikes, as indicated by line 610.

Figure 7:
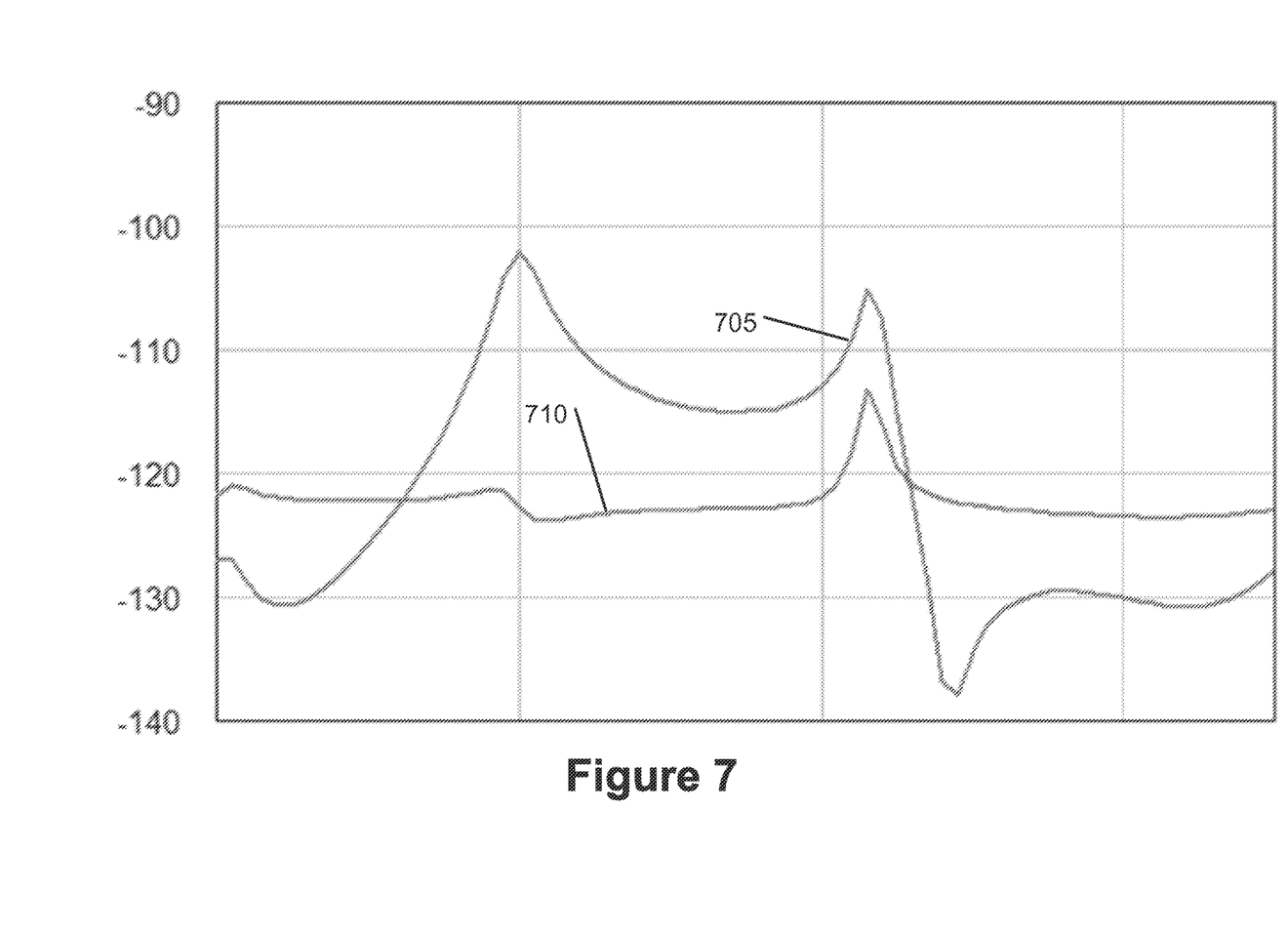
FIG. 7 is a graph of simulated results of performance of an example BAW resonator, in accordance with some embodiments.

FIG. 7 depicts a simulated example graph related to InterModulation Distortion 2 High (IMD2H). IMD2H may be similar to IMD2L, as described above, however the "H" may indicate that the tone at the ANT side of the module may be at a high frequency. The (IMD2H) characteristic may be measured in the Rx passband for a signal applied in the Tx passband and a signal applied at the antenna side, where the signal in the Rx passband is assumed to be based on a subtraction of the signal in the Tx passband from the signal applied at the antenna side. Generally, the y axis indicates power measured in dBm, and the x axis indicates frequency measured in MHz. Line 705 indicates a legacy SMR BAW without a balancing capacitor such as balancing capacitor 120. Line 610 indicates an embodiment of an SMR BAW such as SMR BAW/s 200/300/400 with an implementation of balancing capacitor 120. As can be seen with line 705, the legacy SMR BAW may experience two significant power spikes as frequency increases. However, the SMR BAW with the balancing capacitor 120 may not experience the same power spikes, or at least experience reduced power spikes, as indicated by line 710.

The SMR BAWs 200, 300, and 400 are depicted as having stacks of 3 mirror metal layers, and the extended areas 340 and 240 are depicted as being coplanar with the middle mirror metal layer of the SMR BAW 200 or 300, e.g., mirror metal 235. In other embodiments, the SMR BAWs 200, 300, and/or 400 may have stacks of more or fewer mirror metal layers. Additionally, the extended areas 240 and 340 may be coplanar with different ones of the mirror metal layers 230/330. For example, the extended areas 240 and/or 340 may be higher or lower than depicted in FIGS. 2 and/or 3, respectively. In some embodiments, various embodiments depicted herein may be combined or modified. For example, in some embodiments, an SMR BAW may have both extended area 240 with capacitive effect 245 and extended area 340 with capacitive effects 345/347.

Figure 8:
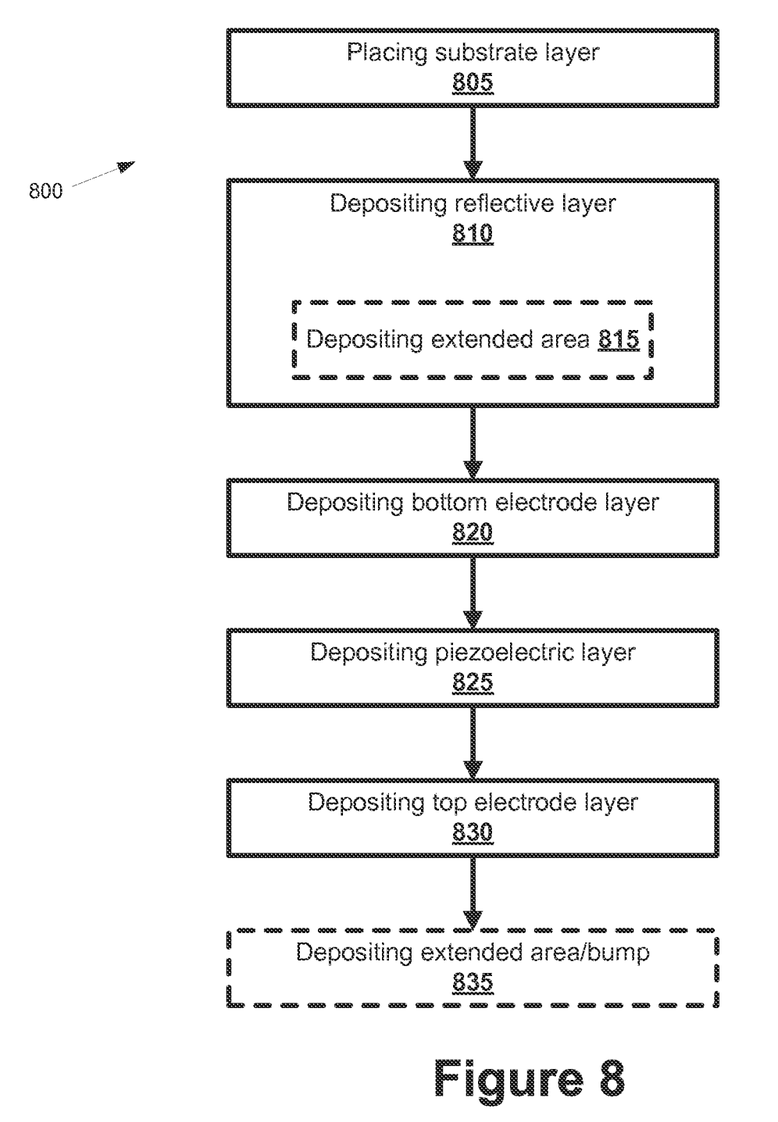
FIG. 8 is a flowchart depicting a manufacturing operation of a BAW resonator in accordance with some embodiments.

FIG. 8 depicts an example process 800 of generating an SMR BAW with a balancing capacitor such as one of SMR BAWs 200/300/400. Initially, a substrate layer such as an Si substrate may be placed at 805. Specifically, the substrate layer may be grown, or an already existing substrate layer may be used or placed at 805 for the manufacturing process. Next, a reflective layer may be deposited on the substrate layer at 810. Deposition of the reflective layer may include depositing a dielectric such as dielectrics 217/317/417 and one or more mirror metal layers 230/235/330/430. In some embodiments, deposition of the reflective layer at 810 may further include deposition of an extended area such as extended area 240/340 at 815.

Next, the process 800 may include deposition of the bottom electrode layer 211/311/411 at 820. Specifically, deposition of the bottom electrode layer may include deposition of electrodes 215/216/315/316/415/416 and/or deposition of extra electrode element 350.

The process 800 may then include deposition of a piezoelectric layer such as piezoelectric layer 210/310/410 at element 825. The process may then include deposition of a top electrode such as top electrode layer 205/305/405 at 830.

The process 800 may then optionally include deposition of a bump such as bump 460 and/or deposition of an extended area such as extended area 440 at 835.

It will be understood that process 800 is intended merely as an example overview of a process, and in embodiments other processes may include mechanical/chemical/electrical/optical etching to form voids or spaces for one or more layers or elements or to form vias. In some embodiments certain steps may be performed in an order different than that shown in process 800. In embodiments, the deposition of certain layers may be performed by lamination, sputter deposition, and/or some other deposition process.

As noted above, in some embodiments, the bottom electrodes of the various resonators of SMR BAWs 200, 300, and 400 may be embedded in a dielectric, which may cause the parasitic capacitance to be relatively high if the bottom electrodes are used to couple the resonators to one another. By contrast, the top electrodes of the various resonators of SMR BAWs 200, 300, and 400 may not be embedded in a dielectric, so the parasitic capacitance may be relatively low if the top electrodes of the resonators are used to couple the resonators to one another as shown in FIGS. 1-4. As described above, the SMR BAWs 200, 300, and 400 may therefore include resonators that share a single top electrode (e.g. top electrode 205), and separate bottom electrodes (e.g., 215 and 315.) However, in other embodiments (not shown herein), SMR BAWs may have two resonators that share a single bottom electrode and have two separate top electrodes.

Figure 9:
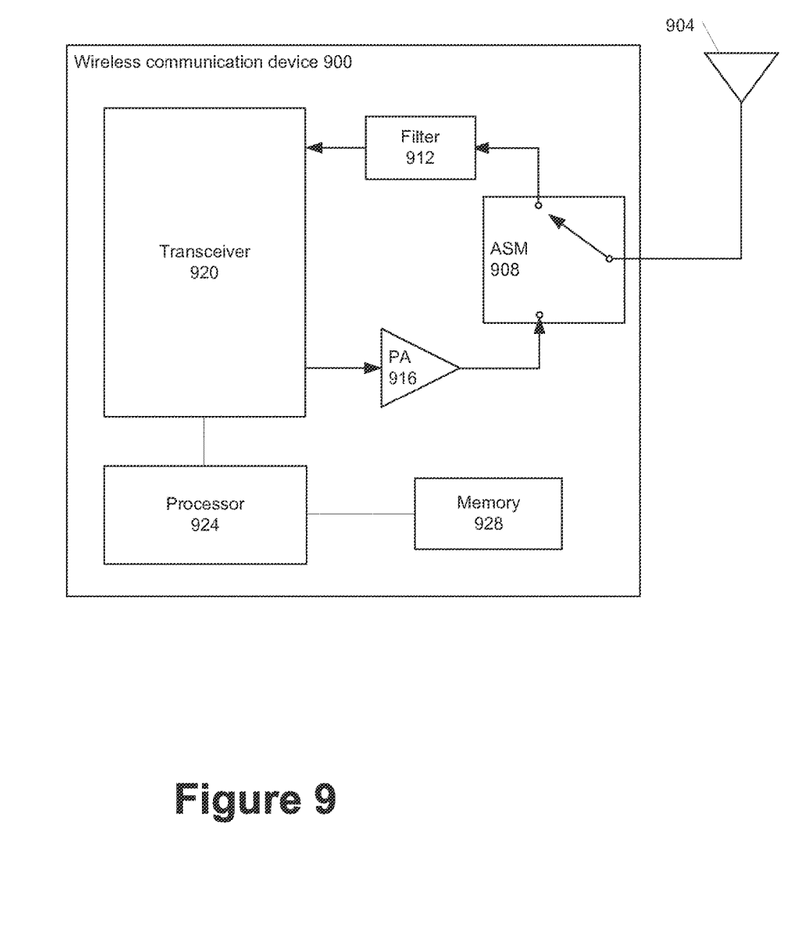
FIG. 9 illustrates a wireless communication device in accordance with some embodiments.

A wireless communication device 900 is illustrated in FIG. 9 in accordance with some embodiments. The wireless communication device 900 may have an antenna structure 904, an antenna switch module (ASM) 908, a filter 912, a power amplifier (PA) 916, a transceiver 920, a processor 924, and a memory 928 coupled with each other at least as shown.

The antenna structure 904 may include one or more antennas to transmit and receive radio frequency (RF) signals over the air. The antenna structure 904 may be coupled with the ASM 908 that operates to selectively couple the antenna structure with the filter 912 or the PA 916. When receiving incoming RF signals, the ASM 908 may couple the antenna structure 904 with the filter 912. The filter 912 may include one or more SMR BAWs such as SMR BAWs 200/300/400. In some embodiments, the filter 912 may include a first plurality of series BAW resonators and a second plurality of shunt BAW resonators. The filter 912 may filter the RF signals received from the ASM 908 and pass portions of the RF signals within a predetermined bandpass to the transceiver 920.

When transmitting outgoing RF signals, the ASM 908 may couple the antenna structure 904 with the PA 916. The PA 916 may receive RF signals from the transceiver 920, amplify the RF signals, and provide the RF signals to the antenna structure 904 for over-the-air transmission.

The processor 924 may execute a basic operating system program, stored in the memory 928, in order to control the overall operation of the wireless communication device 900. For example, the main processor 924 may control the reception of signals and the transmission of signals by the transceiver 920. The main processor 924 may be capable of executing other processes and programs resident in the memory 928 and may move data into or out of memory 928, as desired by an executing process.

The transceiver 920 may receive outgoing data (e.g., voice data, web data, e-mail, signaling data, etc.) from the processor 924, may generate RF signals to represent the outgoing data, and provide the RF signals to the PA 916. Conversely, the transceiver 920 may receive RF signals from the filter 912 that represent incoming data. The transceiver 920 may process the RF signals and send incoming signals to the processor 924 for further processing.

In various embodiments, the wireless communication device 900 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

Those skilled in the art will recognize that the wireless communication device 900 is given by way of example and that, for simplicity and clarity, only so much of the construction and operation of the wireless communication device 900 as is necessary for an understanding of the embodiments is shown and described. Various embodiments contemplate any suitable component or combination of components performing any suitable tasks in association with wireless communication device 900, according to particular needs. Moreover, it is understood that the wireless communication device 900 should not be construed to limit the types of devices in which embodiments may be implemented.

Various example embodiments are described below.

Example 1 may include a bulk acoustic wave (BAW) resonator comprising: a first resonator that includes a first top electrode and a first bottom electrode; a second resonator that includes a second top electrode coupled with the first top electrode and a second bottom electrode; a parasitic capacitive structure coupled with the first and second top electrodes and positioned between the first and second top electrodes and a ground; and a balancing capacitive structure coupled with the first top electrode and the first bottom electrode.

Example 2 may include the BAW resonator of Example 1, wherein a capacitance of the balancing capacitive structure is smaller than a capacitance of the first resonator.

Example 3 may include the BAW resonator of Examples 1 or 2, wherein a load impedance of the balancing capacitive structure is based on a load impedance of the first resonator, a load impedance of the second resonator, a load impedance of the parasitic capacitive structure, and a load impedance of a load coupled to the second bottom electrode and positioned between the second bottom electrode and the ground.

Example 4 may include the BAW resonator of Example 3, wherein the load impedance of the balancing capacitive structure is ZBalancing and $$Z_{Balancing} = \frac{Z_{Resonator1} * Z_{Parasitic}}{Z_{Resonator2} + Z_{Load}}$$

wherein ZResonator1 is the load impedance of the first resonator, ZParasitic is the load impedance of the parasitic capacitive structure, ZResonator2 is the load impedance of the second resonator, and ZLoad is the load impedance of the load.

Example 5 may include the BAW resonator of Examples 1 or 2, wherein the balancing capacitive structure includes a metal positioned within the BAW resonator to cause a capacitive effect between the metal and the top electrode.

Example 6 may include the BAW resonator of Example 5, wherein the metal is Tungsten (W).

Example 7 may include the BAW resonator of Examples 1 or 2, wherein the first resonator and the second resonator include a piezoelectric layer and a reflective layer that includes a reflective metal.

Example 8 may include the BAW resonator of Example 7, wherein the piezoelectric layer includes Aluminum Nitride (AlN).

Example 9 may include the BAW resonator of Examples 1 or 2, wherein the top electrode, the first bottom electrode, or the second bottom electrode include an Aluminum-Copper compound (AlCu) or Tungsten (W).

Example 10 may include a bulk acoustic wave (BAW) resonator comprising: a first resonator that includes a piezoelectric layer between a first electrode and a second electrode, and a reflective layer; a second resonator that includes the piezoelectric layer between the first electrode and a third electrode, and the reflective layer; and a capacitive element positioned such that a capacitive effect is formed between the first electrode and the capacitive element.

Example 11 may include the BAW resonator of Example 10, wherein a capacitive effect is further formed between the second electrode and the capacitive element.

Example 12 may include the BAW resonator of Example 10, wherein the capacitive element includes Tungsten (W).

Example 13 may include the BAW resonator of any of Examples 10-12, wherein the first resonator includes a first mirror metal in the reflective layer and the second resonator includes a second mirror metal in the reflective layer.

Example 14 may include the BAW resonator of Example 13, wherein the reflective layer further includes Silicon Oxide (SiO2).

Example 15 may include the BAW resonator of Example 13, wherein the first or second mirror metal are Tungsten (W).

Example 16 may include the BAW resonator of Example 13, wherein the capacitive element is coupled with the first mirror metal.

Example 17 may include the BAW resonator of Example 13, wherein the capacitive element is separate from, but co-planar with, the first mirror metal.

Example 18 may include the BAW resonator of any of Examples 10-12, wherein the capacitive element is physically coupled with the second electrode.

Example 19 may include the BAW resonator of any of Examples 10-12, wherein the first electrode, second electrode, or third electrode include an Aluminum-Copper compound (AlCu) or Tungsten (W).

Example 20 may include the BAW resonator of any of Examples 10-12, wherein the piezoelectric layer includes Aluminum Nitride (AlN).

Example 21 may include the BAW resonator of any of Examples 10-12, wherein the first electrode is a top electrode, the second electrode is a first bottom electrode, and the third electrode is a second bottom electrode; and wherein the reflective layer is coupled with the first bottom electrode on a side of the first bottom electrode opposite a side of the first bottom electrode that is coupled with the piezoelectric layer.

Example 22 may include the BAW resonator of any of Examples 10-12, wherein the first electrode is a bottom electrode, the second electrode is a top electrode, and the third electrode is a second top electrode; and wherein the reflective layer is coupled with the bottom electrode on a side of the bottom electrode opposite a side of the bottom electrode that is coupled with the piezoelectric layer.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A bulk acoustic wave (BAW) resonator comprising:
    a first resonator that includes a first top electrode and a first bottom electrode;
    a second resonator that includes a second top electrode coupled with the first top electrode and a second bottom electrode;
    a parasitic capacitive structure coupled with the first and second top electrodes and positioned between the first and second top electrodes and a ground; and
    a balancing capacitive structure coupled with the first top electrode and the first bottom electrode.

2. The BAW resonator of claim 1, wherein a capacitance of the balancing capacitive structure is smaller than a capacitance of the first resonator.

3. The BAW resonator of claim 1, wherein a load impedance of the balancing capacitive structure is based on a load impedance of the first resonator, a load impedance of the second resonator, a load impedance of the parasitic capacitive structure, and a load impedance of a load coupled to the second bottom electrode and positioned between the second bottom electrode and the ground.

4. The BAW resonator of claim 3, wherein the load impedance of the balancing capacitive structure is $Z_{Balancing}$ and $$Z_{Balancing} = \frac{Z_{Resonator1} * Z_{Parasitic}}{Z_{Resonator2} + Z_{Load}}$$

wherein $Z_{Resonator1}$ is the load impedance of the first resonator, $Z_{parasitic}$ is the load impedance of the parasitic capacitive structure, $Z_{Resonator2}$ is the load impedance of the second resonator, and $Z_{Load}$ is the load impedance of the load.

5. The BAW resonator of claim 1, wherein the balancing capacitive structure includes a metal positioned within the BAW resonator to cause a capacitive effect between the metal and the top electrode.

6. The BAW resonator of claim 5, wherein the metal is Tungsten (W).

7. The BAW resonator of claim 1, wherein the first resonator and the second resonator include a piezoelectric layer and a reflective layer that includes a reflective metal.

8. The BAW resonator of claim 7, wherein the piezoelectric layer includes Aluminum Nitride (AlN).

9. The BAW resonator of claim 1, wherein the top electrode, the first bottom electrode, or the second bottom electrode include an Aluminum-Copper compound (AlCu) or Tungsten (W).

10. A bulk acoustic wave (BAW) resonator comprising:
    a first resonator that includes a piezoelectric layer between a first electrode and a second electrode, and a reflective layer having a first mirror metal;
    a second resonator that includes the piezoelectric layer between the first electrode and a third electrode, and the reflective layer having a second mirror metal; and
    a capacitive element positioned such that a capacitive effect is formed between the first electrode and the capacitive element, wherein the capacitive element is separate from, but co-planar with the first mirror metal.

11. The BAW resonator of claim 10, wherein a capacitive effect is further formed between the second electrode and the capacitive element.

12. The BAW resonator of claim 10, wherein the capacitive element includes Tungsten (W).

13. The BAW resonator of claim 10, wherein the reflective layer further includes Silicon Oxide ($SiO_2$).

14. The BAW resonator of claim 10, wherein the first or second mirror metal are Tungsten (W).

15. The BAW resonator of claim 10, wherein the capacitive element is physically coupled with the second electrode.

16. The BAW resonator of claim 10, wherein the first electrode, second electrode, or third electrode include an Aluminum-Copper compound (AlCu) or Tungsten (W).

17. The BAW resonator of claim 10, wherein the piezoelectric layer includes Aluminum Nitride (AlN).

18. The BAW resonator of claim 10, wherein the first electrode is a top electrode, the second electrode is a first bottom electrode, and the third electrode is a second bottom electrode; and wherein the reflective layer is coupled with the first bottom electrode on a side of the first bottom electrode opposite a side of the first bottom electrode that is coupled with the piezoelectric layer.

19. The BAW resonator of claim 10, wherein the first electrode is a bottom electrode, the second electrode is a top electrode, and the third electrode is a second top electrode; and wherein the reflective layer is coupled with the bottom electrode on a side of the bottom electrode opposite a side of the bottom electrode that is coupled with the piezoelectric layer.

\* \* \* \* \*